(12) United States Patent  
Ejury

(10) Patent No.: US 8,981,763 B2
(45) Date of Patent: Mar. 17, 2015

(54) DI/DT CURRENT SENSING

(75) Inventor: Jens Ejury, Fremont, CA (US)

(73) Assignee: Infineon Technologies AG, Neubiberg (DE)

( * ) Notice: Subject to any disclaimer, the term of this patent is extended or adjusted under 35 U.S.C. 154(b) by 893 days.

(21) Appl. No.: 12/887,835

(22) Filed: Sep. 22, 2010

(65) Prior Publication Data

US 2012/0068691 A1 Mar. 22, 2012

(51) Int. Cl.
*G01R 15/18* (2006.01)
*G01R 19/00* (2006.01)

(52) U.S. Cl.
CPC .......... *G01R 15/181* (2013.01); *G01R 19/0092* (2013.01)
USPC ...................................... 324/127; 324/117 R

(58) Field of Classification Search
USPC .............. 324/103 R, 117 R, 117 H, 126, 127, 324/762.01–762.03, 260–263
See application file for complete search history.

(56) References Cited

U.S. PATENT DOCUMENTS

| | | | | |
|---|---|---|---|---|
| 4,106,095 A | * | 8/1978 | Yarbrough | 705/412 |
| 5,006,846 A | * | 4/1991 | Granville et al. | 340/870.28 |
| 5,220,495 A | * | 6/1993 | Zulaski | 363/84 |
| 5,565,783 A | * | 10/1996 | Lau et al. | 324/522 |
| 5,568,047 A | * | 10/1996 | Staver et al. | 324/127 |
| 5,831,424 A | * | 11/1998 | Jensen | 324/117 R |
| 6,445,188 B1 | * | 9/2002 | Lutz et al. | 324/508 |
| 7,265,531 B2 | * | 9/2007 | Stauth et al. | 324/117 H |
| 8,269,482 B2 | * | 9/2012 | Banhegyesi | 324/127 |
| 2003/0142522 A1 | * | 7/2003 | Spitz | 363/145 |
| 2008/0024881 A1 | * | 1/2008 | Shinohara | 359/749 |
| 2008/0054881 A1 | * | 3/2008 | Kim | 324/117 R |
| 2010/0264906 A1 | * | 10/2010 | Shamir et al. | 324/127 |
| 2010/0315066 A1 | * | 12/2010 | Hashio et al. | 324/156 |

FOREIGN PATENT DOCUMENTS

| | | |
|---|---|---|
| CN | 86209922 U | 7/1987 |
| CN | 2566519 Y | 8/2003 |
| CN | 101147308 A | 3/2008 |

* cited by examiner

*Primary Examiner* — Hezron E Williams
*Assistant Examiner* — Hoang Nguyen
(74) *Attorney, Agent, or Firm* — Murphy, Bilak & Homiller, PLLC

(57) ABSTRACT

A circuit includes a power circuit and a current sensing circuit. The power circuit has a main current loop. The current sensing circuit is spaced apart from and electrically decoupled from the power circuit. The current sensing circuit is operable to generate a voltage proportional to an electromagnetic field generated responsive to a current change in the main current loop of the power circuit and generate a current information signal based on the voltage. The current information signal describes the current in the main current loop.

17 Claims, 6 Drawing Sheets

DI/DT CURRENT SENSING

BACKGROUND

Current sensing is required for many types of circuit operations including current mode control, current monitoring, over-current protection and current dependent operation modes. Sensing current in a circuit typically involves the use of resistive elements. Sense resistors increase resistance and lower efficiency. An inductor can be used to sense the current instead of a sense resistor. In yet another alternative, the drain-to-source on resistance of a MOSFET (metal-oxide-semiconductor field effect transistor) can be measured to determine the amount of current flowing in the circuit.

Each of these conventional current sensing techniques require the current sensing signal generated by the sensing element to be routed back to a controller which manages one or more current related functions of the circuit. For example, when implementing current dependent operations in a driver stage of a power circuit, some means must be provided for sensing the current and communicating information about the sensed current back to the circuit. With discrete circuits, this typically involves providing additional feedback traces for connecting the sense device to the circuit and for feeding back the sensed current levels to the controller. All of these additional feedback traces must be carefully routed e.g. on a printed circuit board or within a multi-layer package to ensure normal circuit operation is not adversely affected by the current feedback mechanism, thus complicating the design of the board or package. Also, sensed current signals are usually very small in magnitude and can be rendered unreliable under certain noise conditions.

SUMMARY

According to an embodiment of a circuit, the circuit comprises a power circuit and a current sensing circuit. The power circuit has a main current loop. The current sensing circuit is spaced apart from and electrically decoupled from the power circuit. The current sensing circuit is operable to generate a voltage proportional to an electromagnetic field generated responsive to a current change in the main current loop of the power circuit and generate a current information signal based on the voltage. The current information signal describes the current in the main current loop.

According to a method of operating the circuit, the method comprises generating an electromagnetic field by the power circuit responsive to a current change in the main current loop of the power circuit and generating a voltage by the current sensing circuit that is proportional to the electromagnetic field. The method further includes generating a current information signal by the current sensing circuit based on the voltage, the current information signal describing the current in the main current loop.

According to an embodiment of an integrated circuit package, the package comprises a power circuit and a conductive loop. The power circuit includes a plurality of transistors which form part of a main current loop of the power circuit. The plurality of transistors is arranged in one or more layers of the integrated circuit package. The conductive loop is electrically decoupled from the plurality of transistors. The conductive loop is spaced apart from the plurality of transistors and in close enough proximity to at least part of the main current loop so that the conductive loop is operable to generate a voltage proportional to an electromagnetic field generated responsive to a change in current in the main current loop. A first external terminal can be coupled to one end of the conductive loop and a second external terminal can be coupled to the other end of the conductive loop for providing connection points for the conductive loop at an external surface of the integrated circuit package.

According to a method of fabricating the integrated circuit package, the method comprises arranging the power circuit including the plurality of transistors which form part of the main current loop of the power circuit in one or more layers of the integrated circuit package and arranging the conductive loop so that the loop is electrically decoupled from and spaced apart from the plurality of transistors. The conductive loop is arranged in close enough proximity to at least part of the main current loop so that the conductive loop is operable to generate a voltage proportional to an electromagnetic field generated responsive to a change in current in the main current loop.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
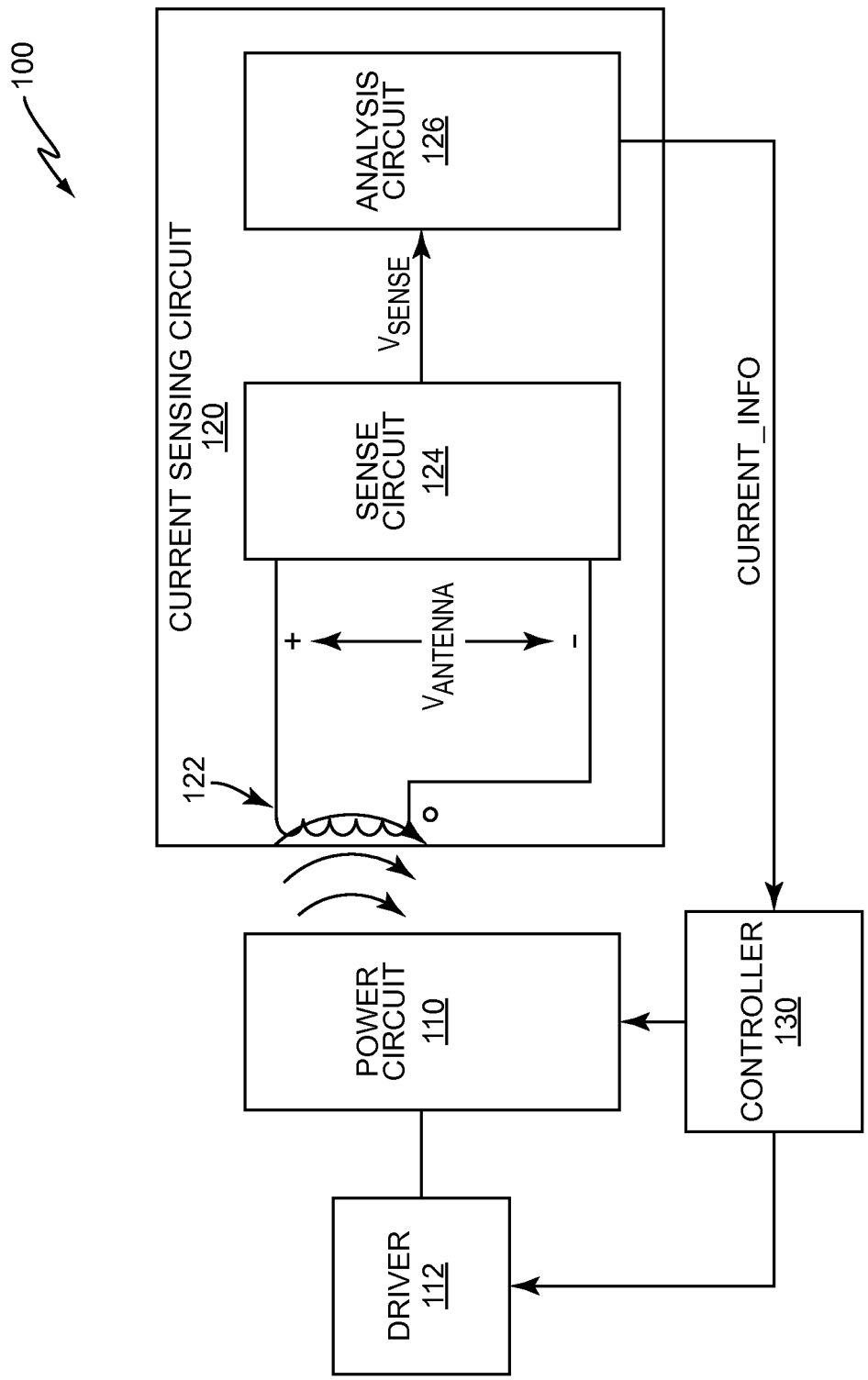
FIG. 1 illustrates an embodiment of a circuit including a power circuit and a current sensing circuit electromagnetically coupled to the power circuit.

FIG. 1 illustrates an embodiment of a circuit 100 that includes a power circuit 110 and a current sensing circuit 120 electromagnetically coupled to the power circuit 110. The power circuit 110 and current sensing circuit 120 can be integrated on the same or different semiconductor die. Alternatively the current sensing circuit 120 can be part of the package assembly housing the power circuit 110. The power circuit 110 has a main current loop. In some embodiments, a driver 112 is included in the same package as the main current loop of the power circuit 110. The power circuit 110 operates at a high enough power level so that an electromagnetic field, indicated by the curved lines in FIG. 1, is generated responsive to a phase transition in the main current loop and is strong enough to be sensed by the current sensing circuit 120. The current sensing circuit 120 includes a conductive loop 122 positioned within the electromagnetic field generated by the power circuit 110. The conductive loop 122 can be integrated in the same semiconductor die as the power circuit 110, or included within or attached to a package housing the power circuit 110.

A voltage $v_{antenna}$ develops across the terminals of the conductive loop 122 that is proportional to the electromagnetic field generated by the power circuit 110. The conductive loop 122 in effect functions as an antenna. The voltage produced by the conductive loop 122 corresponds to the current in the main current loop of the power circuit 110 and is sensed by a sense circuit 124 included in or associated with the current sensing circuit 120. The voltage of the conductive loop 122 can be rectified, amplified, smoothed, etc. by the sense circuit 124 to provide a signal $v_{sense}$ that can be processed by an analysis circuit 126 included in or associated with the current sensing circuit 120.

The analysis circuit 126 generates a current information signal current_info based on the output of the sense circuit 124. The current information signal describes the current in the main current loop and is provided to a controller 130. The controller 130 manages one or more current dependent operations of the power circuit 110 in response to the current information signal such as operation of the driver 112. For example, the controller 130 can implement current mode control, current monitoring, over-current protection and/or one or more current dependent operation modes at the power circuit 110. The analysis circuit 126 may be included in or associated with the controller 130 instead of the current sensing circuit 120 in some embodiments. According to these embodiments, the output of the sense circuit 124 is provided to the controller 130 which analyses and processes the received signal and takes corresponding action.

In either case, the controller 130 implements one or more current related functions without the current sensing circuit 120 being electrically coupled to the power circuit 110. That is, the current sensing circuit 120 is spaced apart from and electrically decoupled from the power circuit 110. During operation of the circuit 100, an electromagnetic field is generated by the power circuit 110 responsive to a current change in the main current loop of the power circuit 110. A voltage proportional to the electromagnetic field develops across the terminals of the conductive loop 122 included in or associated with the current sensing circuit 120. The sense circuit 124 senses the voltage and the analysis circuit 126 generates the current information signal based on the sensed voltage and provides the current information signal to the controller 130 for implementing one or more current dependent operations at the power circuit 110 based on the current information signal.

Figure 2:
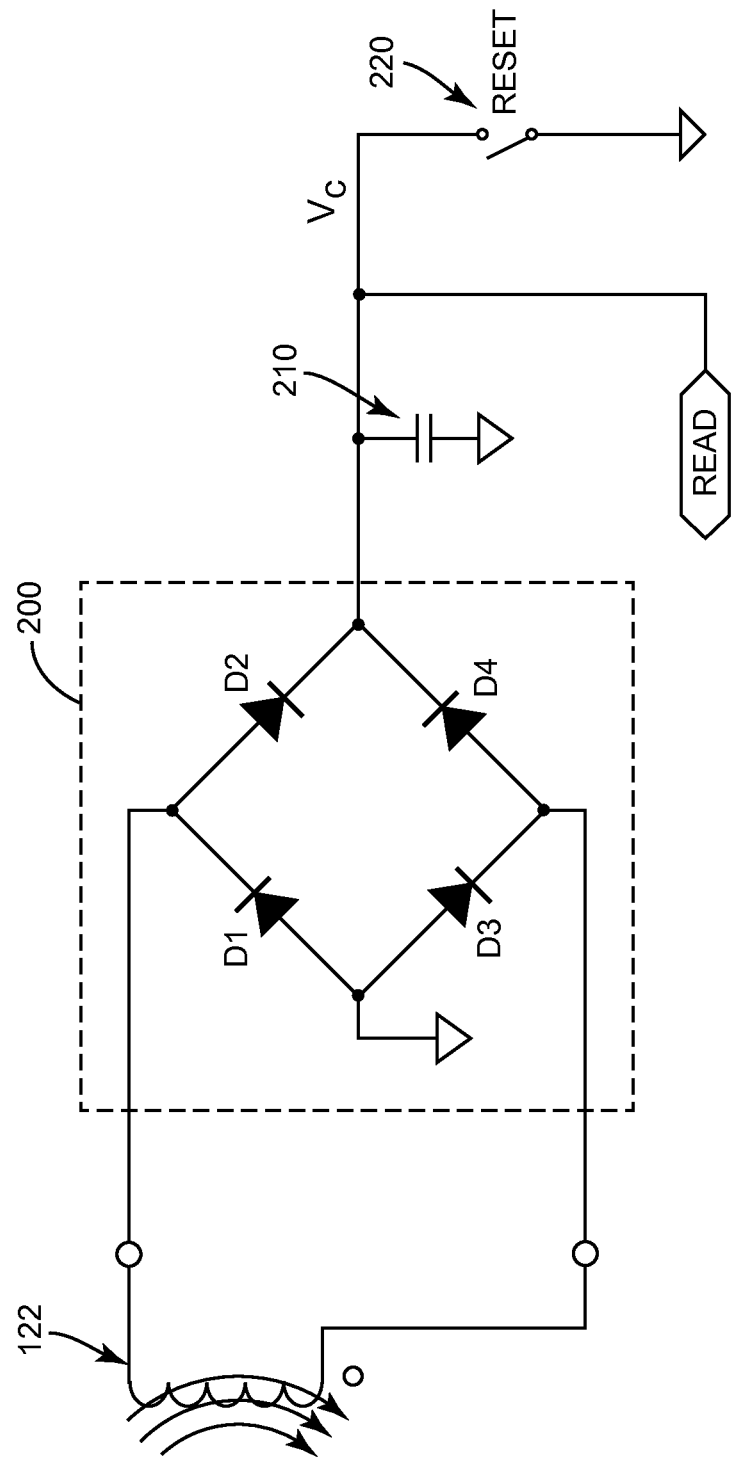
FIG. 2 illustrates an embodiment of the current sensing circuit shown in FIG. 1.

FIG. 2 illustrates an embodiment of the sense circuit 124 included in or associated with the current sensing circuit 120. The sense circuit 124 includes a plurality of diodes D1, D2, D3, D4 coupled together to form a bridge rectifier 200. The bridge rectifier 200 is coupled to the terminals of the conductive loop 122 and rectifies the voltage electromagnetically induced at the conductive loop 122. The sense circuit 124 also includes a capacitor 210 coupled to the rectifier 200. The capacitor 210 accumulates charge responsive to the rectifier output. The voltage across the capacitor 210 is related to the current in the main current loop due to the electromagnetic coupling between the conductive loop 122 of the current sensing circuit 120 and the power circuit 110. The sense circuit 124 further includes a switch device 220 coupled to the capacitor 210. The switch device 220 periodically resets the capacitor 210 responsive to a reset signal e.g. by discharging the capacitor 210 to ground. In some embodiments, the switch device 220 is actuated so that the capacitor 210 integrates the rectified voltage over a plurality of sampling periods prior to resetting the capacitor 210 so that the sensed voltage is smoothed or averaged over some period of time.

The magnitude of the voltage induced in the conductive loop 122 of the current sensing circuit 120 is influenced by several factors. For example, the transconductance i.e. the ratio of current change at the power circuit 110 to the voltage change at the conductive loop 122 is a function of the current as given by:

$$g_{fs} = f(I_D) \quad (1)$$

The transconductance is monotone rising and therefore $$\frac{di}{dt}$$

increases for higher output current levels at the power circuit 110 unless the phase transition at the main current loop is inductively limited by the conductive loop 122. In addition, reverse recovery current also increases with output current. The voltage induced in the conductive loop 122 is a function of both of these effects.

The analysis circuit 126 senses the capacitor voltage $V_c$ and interprets the sensed voltage to generate the current information signal used by the controller 130. In one embodiment, the analysis circuit 126 defines one or more threshold values related to a given sensed voltage signature. The analysis circuit 126 translates the sensed capacitor voltage into a current value for the power circuit 110 based on the threshold values. In one embodiment, the analysis circuit 126 compares the sensed capacitor voltage to the thresholds and generates the current information signal based on which of the thresholds the sensed voltage exceeds. The analysis circuit 126 can analyze the sensed capacitor voltage over several sampling periods so that the current information signal provided to the controller 130 is smoothed or averaged over some period of time. The analysis circuit 126 can be an analog-to-digital converter, amplifier, trigger circuit or any other circuit suitable for sensing and interpreting the voltage of the sense circuit capacitor 210. The analysis circuit 126 is not shown in FIG. 2 for ease of illustration only.

Figure 3:
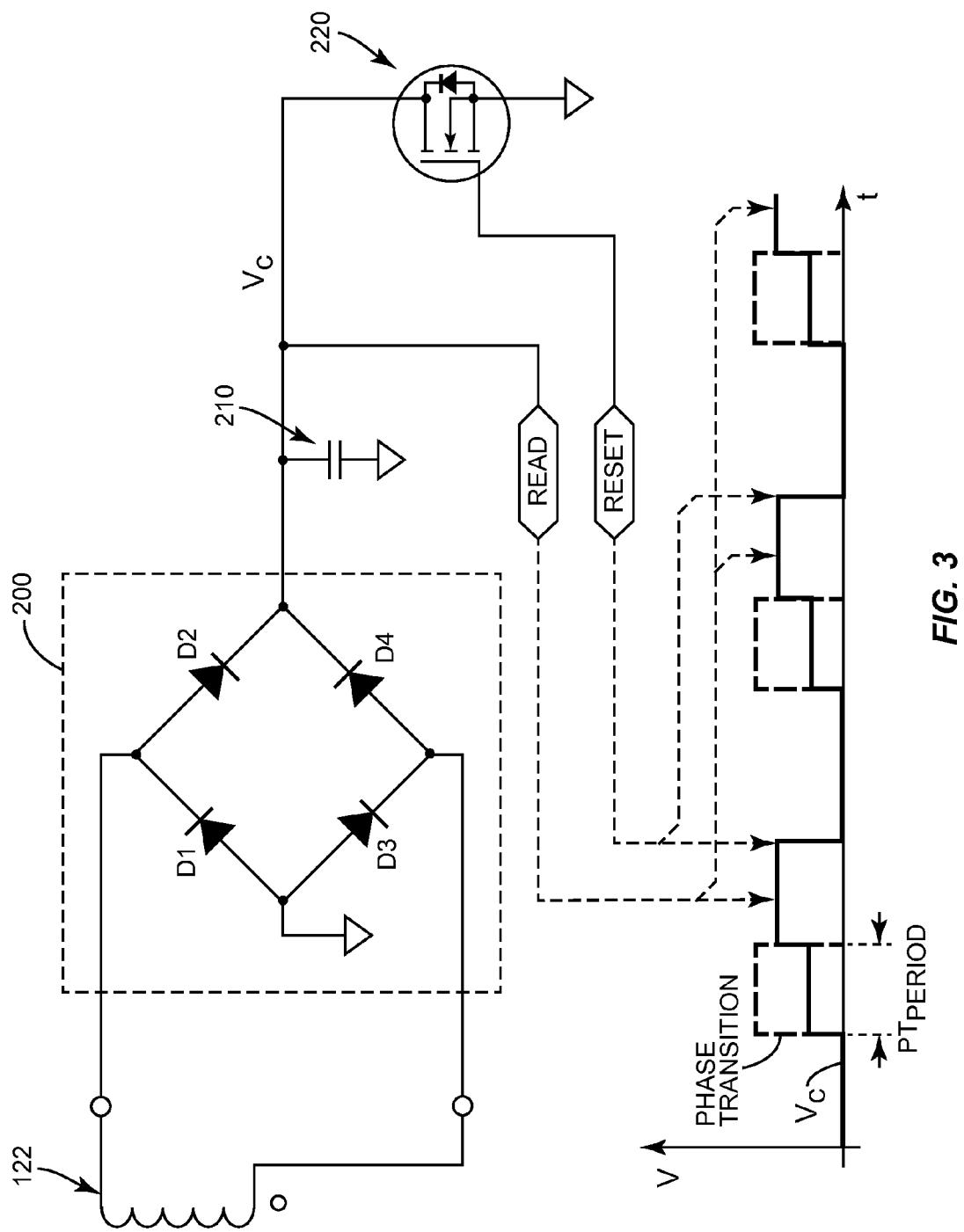
FIG. 3 illustrates another embodiment of the current sensing circuit shown in FIG. 1 and a waveform diagram associated with the operation of the current sensing circuit.

FIG. 3 illustrates another embodiment of the sense circuit 124 included in or associated with the current sensing circuit 120. As with FIG. 2, the analysis circuit 126 is not shown in FIG. 3 for ease of illustration only. According to the embodiment shown in FIG. 3, the diodes D1, D2, D3, D4 that form the bridge rectifier 200 are silicon rectifier diodes each of which has a negative forward voltage temperature coefficient. As such, higher temperatures result in a lower forward voltage drop across the diodes D1, D2, D3, D4. The switch device 220 is implemented as a MOSFET Q1. The transconductance of the MOSFET Q1 decreases as temperature increases. Therefore the communicated signal voltage decreases as the temperature of the sense circuit 124 increases. The circuit 100 can be tuned so that the decreased communicated voltage by the MOSFET Q1 is offset by the lower voltage drop of the bridge rectifier 200. For example, tuning can be performed based on the coupling between the current sensing circuit 120 and the power circuit 110. A relatively weak coupling between the power circuit 110 and the conductive loop 122 gives the diodes D1, D2, D3, D3 more weight. As such, a higher current limit occurs at lower temperatures and a lower current limit occurs at higher temperatures.

FIG. 3 also illustrates a waveform diagram for the capacitor voltage $V_c$ sensed by the sense circuit 124 during different periods of operation. The analysis circuit 126 periodically resets the capacitor 210 after every one or more switching cycles by activating the reset signal applied to the gate of the MOSFET Q1. The capacitor 210 integrates the rectifier output over a plurality of sampling periods prior to being reset when the reset signal applied to the gate of the MOSFET Q1 is activated once every plurality of sampling periods. Alternatively, the capacitor 210 can be reset every sampling period by correspondingly activating the reset signal. In either case, the charge accumulated by the capacitor 210 depends on the energy harvested during a phase transition at the main current loop of the power circuit 110. The charge accumulated by the capacitor 210 is proportional to the coupling factor k of the conductive loop 122 and yields a voltage across the capacitor 210 as given by:

$$v_{antenna} = k \cdot L \cdot \frac{di}{dt} \quad (2)$$

where L is the inductance of the conductive loop 122 and $$\frac{di}{dt}$$

is the rate of current change in the main loop of the power circuit 110.

If the inductance of the conductive loop 122 limits the phase transition in the main current loop of the power circuit 110 as described previously herein, $$\frac{di}{dt}$$

is fixed and the voltage induced at the conductive loop 122 is attenuated. In another scenario, the MOSFET Q1 or more generally switch device 220 of the sense circuit 124 limits the phase transition in the main current loop of the power circuit 110. In this scenario, $$\frac{di}{dt}$$

increases responsive to increases in the drain current $I_D$. Also, $g_{fs} = f(I_D)$ is monotone rising also as previously described herein. The capacitor 210 of the sense circuit 124 is charged by the conductive loop voltage $v_{antenna}$ for the duration t as given by:

$$v_c = (v_{antenna} - 2 \cdot v_{Fdiode}) \cdot (1 - e^{-\frac{t}{\tau}}) \quad (3)$$

where t is the transition time for a phase transition at the main current loop of the power circuit 110 as shown in FIG. 3, $v_{Fdiode}$ is the forward voltage of the diodes D1, D2, D3, D4, and τ is the time constant of the current sensing circuit 120. The time constant τ is a product of the resistive part of the conductive loop 122, diodes D1, D2, D3, D4 and capacitor 210, and the capacitance of the capacitor 210. The time constant τ is preferably chosen so that a significant voltage signal can be obtained. In one embodiment, τ is chosen to be one third of the phase transition period $PT_{period}$. For example, τ is 3.33 ns or less for a phase transition period of 10 ns. Continuing with this purely illustrative example, the resistive components of the sense circuit 124 may have a total resistance R of 1Ω. The capacitance of the capacitor 210 in general is given by:

$$C = \frac{\tau}{R} \quad (4)$$

with C=3.3 nF for this illustrative example.

The analysis circuit 126 senses the voltage $V_c$ of the capacitor 210 after a phase node transition as indicated by the Read event shown in FIG. 3. The analysis circuit 126 uses the sensed voltage to generate the current information signal provided to the controller 130 as previously described herein. In addition, the analysis circuit 126 causes the capacitor 210 to be reset by activating the Reset signal also shown in FIG. 3. The controller 130 manages one or more current dependent operations of the power circuit 110 in response to the information generated by the current sensing circuit 120.

Figure 4:
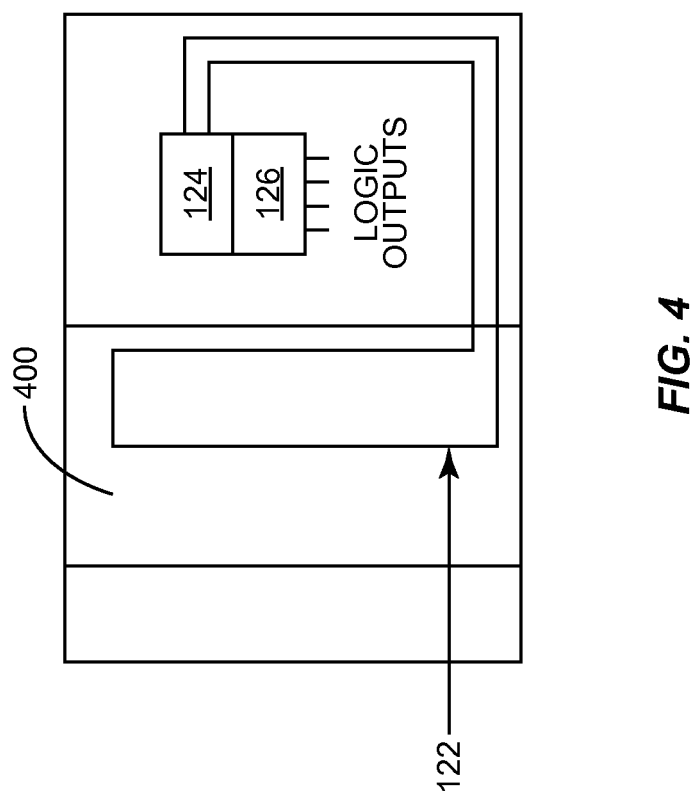
FIG. 4 illustrates a top-down plan view of an embodiment of a conductive loop of the current sensing circuit spaced apart from and positioned over at least a portion of the power circuit.

FIG. 4 illustrates a top-down plan view of a portion of the power and current sensing circuits 110, 120 e.g. as integrated together in the same semiconductor die or on the same printed circuit board or package. According to this embodiment, the power circuit 110 includes at least one power MOSFET 400 which forms part of the main current loop of the power circuit 110. The conductive loop 122 of the current sensing circuit 120 is spaced apart from and positioned over at least a portion of the power MOSFET 400. An electromagnetic field generated by the power MOSFET 400 induces a voltage in the conductive loop 122 which is integrated and stored by the capacitor 210 of the sense circuit 124 as previously described herein. The capacitor voltage is sensed and interpreted by the analysis circuit 126 which generates one or more logic signals which describe the current in the main current loop of the power circuit 110, the logic signal(s) being input to the controller 130 which is not shown in FIG. 3.

Figure 5:
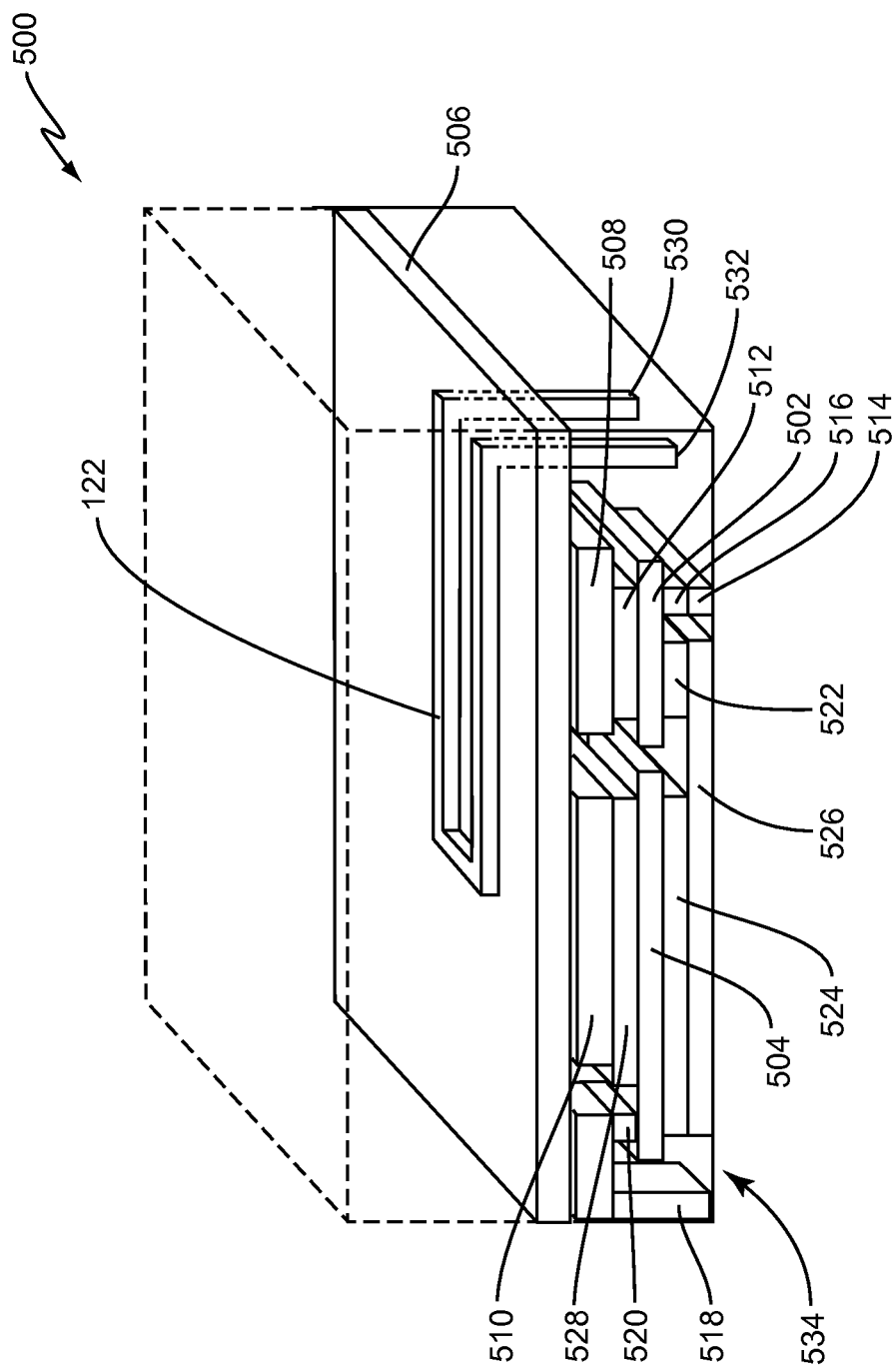
FIG. 5 illustrates a schematic view of an embodiment of an integrated circuit package including a power circuit and a current sensing circuit electromagnetically coupled to the power circuit.

FIG. 5 illustrates an embodiment of an integrated circuit package 500 that includes the power circuit 110 and the conductive loop 122 of the current sensing circuit 120. The power circuit 110 includes a plurality of transistors 502, 504 which form part of the main current loop of the power circuit 110. The transistors 502, 504 are arranged in one or more layers of the integrated circuit package 500. The conductive loop 122 of the current sensing circuit 120 is electrically decoupled from and spaced apart from the transistors 502, 504, but in close enough proximity to at least part of the main current loop of the power circuit 110 so that the conductive loop 122 can generate a voltage proportional to the electromagnetic field generated responsive to a change in current in the main current loop. The conductive loop 122 is arranged within the integrated circuit package 500 in a different layer of the package 500 than the transistors 502, 504.

In one embodiment, the power circuit includes a first MOSFET 502 and a second MOSFET 504. The conductive loop 122 of the current sensing circuit 120 is disposed over the first and second MOSFETs 502, 504 and an insulator layer 506 is interposed between the conductive loop 122 and the first and second MOSFETs 502, 504. The first MOSFET 502 is a high-side MOSFET of a power converter circuit such as a synchronous buck converter and the second MOSFET 504 is a low-side MOSFET of the power converter circuit according to an embodiment. The MOSFETs 502, 504 may be integrated on the same die within the package 500 or separate dies as shown in FIG. 5.

The integrated circuit package 500 also includes a voltage plane 508, a reference plane 510 (such as ground) and terminals for providing external connections points to the different components included in the package 500. Certain portions of the package 500 are not shown in FIG. 5 so that the internal components are readily visible. The voltage plane 508 is coupled to the drain 512 of the high-side MOSFET 502. A first gate input terminal 514 is coupled to the gate 516 of the high-side MOSFET 502 and a second gate input terminal 518 is coupled to the gate 520 of the low-side MOSFET 504 for controlling the respective switching states of the MOSFETs 502, 504. The source 522 of the high-side MOSFET 502 is coupled to the drain 524 of the low-side MOSFET 504 via a voltage output terminal 526 of the package 500. The source 528 of the low-side MOSFET 504 is coupled to the reference plane 510. External connection terminals are provided to the voltage and reference planes 508, 510, and are out of view in FIG. 5. One external terminal 530 is coupled to a first end of the conductive loop 122 and another external terminal 532 is coupled to the other end of the conductive loop 122 to provide connection points for the conductive loop 122 at an external surface 534 of the integrated circuit package 500.

Figure 6:
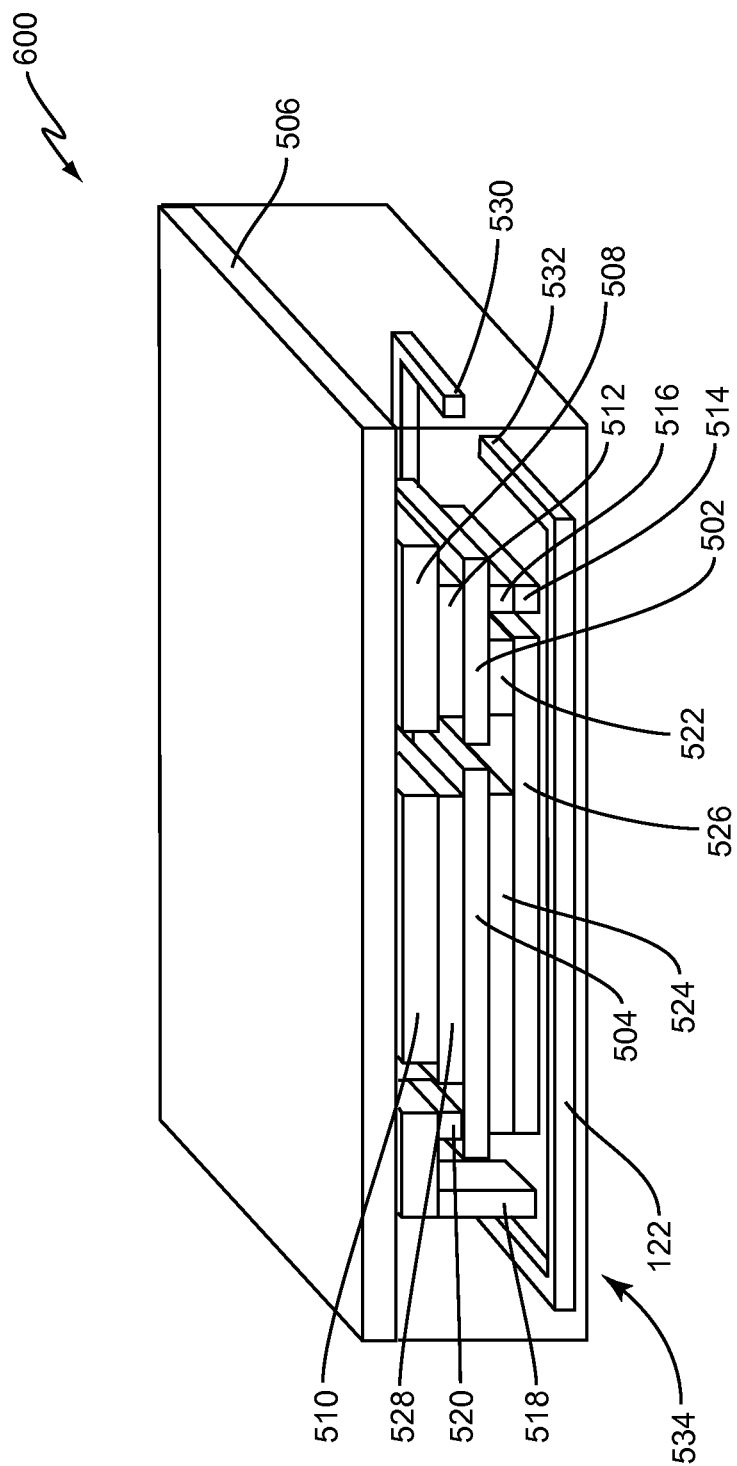
FIG. 6 illustrates a schematic view of another embodiment of an integrated circuit package including a power circuit and a current sensing circuit electromagnetically coupled to the power circuit.

FIG. 6 illustrates another embodiment of an integrated circuit package 600 that includes the power circuit 110 and the conductive loop 122 of the current sensing circuit 120. FIG. 6 is similar to FIG. 5, except the conductive loop 122 is attached to the external surface 534 of the integrated circuit package 600 instead of being embedded within the package 500 as shown in FIG. 5. The conductive loop 122 preferably is attached to the external surface 534 of the integrated circuit package 600 positioned closest to the voltage output terminal 526 of the power circuit 110. This way, the conductive loop 122 is closely coupled in the electromagnetic sense to the power circuit 110 and the magnitude of the voltage induced in the conductive loop 122 is sufficiently large. Depending on various considerations, one or more other components of the current sensing circuit 120 can be embedded within and/or attached to the packages 500, 600 shown in FIGS. 5 and 6. Otherwise, the external connection terminals 530, 532 coupled to the ends of the conductive loop 122 provide adequate coupling to the other current sensing circuit components.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit, comprising:
   a power circuit having a main current loop;
   a current sensing circuit spaced apart from and electrically decoupled from the power circuit, the current sensing circuit operable to generate a voltage proportional to an electromagnetic field generated responsive to a current change in the main current loop of the power circuit and generate a current information signal based on the voltage, the current information signal describing the current in the main current loop; and
   a controller operable to control a current dependent operation of the power circuit based on the current information signal.

2. The circuit of claim 1, wherein the current sensing circuit comprises:
   a conductive loop spaced apart from the power circuit and disposed over at least a portion of the main current loop, the conductive loop electrically decoupled from the power circuit and operable to generate the voltage proportional to the electromagnetic field;
   a rectifier coupled to the conductive loop and operable to rectify the voltage generated by the conductive loop; and
   a capacitor coupled to the rectifier and operable to accumulate charge responsive to the rectified voltage, wherein a voltage across the capacitor is related to the current in the main current loop.

3. The circuit of claim 2, wherein the rectifier comprises a plurality of silicon rectifier diodes coupled together to form a bridge rectifier, each of the plurality of silicon rectifier diodes having a negative forward voltage temperature coefficient.

4. The circuit of claim 2, wherein the current sensing circuit comprises a switch device coupled to the capacitor and operable to periodically reset the capacitor responsive to a reset signal.

5. The circuit of claim 4, wherein the switch device is operable to permit the capacitor to integrate the rectified voltage over a plurality of sampling periods prior to resetting the capacitor.

6. The circuit of claim 2, wherein the current sensing circuit comprises an analysis circuit operable to compare the voltage across the capacitor to a plurality of thresholds and generate the current information signal based on which of the plurality of thresholds the voltage exceeds.

7. The circuit of claim 6, wherein the analysis circuit comprises at least one of an analog-to-digital converter, an amplifier and a trigger circuit.

8. The circuit of claim 6, wherein the analysis circuit is operable to analyze the voltage across the capacitor over a plurality of sampling periods and smooth the current information signal over the plurality of sampling periods.

9. A method of operating a circuit including a power circuit with a main current loop and a current sensing circuit spaced apart from and electrically decoupled from the power circuit, the method comprising:
   generating an electromagnetic field by the power circuit responsive to a current change in the main current loop of the power circuit;
   generating a voltage by the current sensing circuit that is proportional to the electromagnetic field;
   generating a current information signal by the current sensing circuit based on the voltage, the current information signal describing the current in the main current loop; and
   controlling a current dependent operation of the power circuit based on the current information signal.

10. The method of claim 9, comprising:
    generating the voltage to the electromagnetic field by a conductive loop of the current sensing circuit that is spaced apart from the power circuit, disposed over at least a portion of the main current loop, and electromagnetically coupled to at least a portion of the power circuit;

rectifying the voltage generated by the conductive loop; and accumulating charge in a capacitor responsive to the rectified voltage, wherein a voltage across the capacitor is a function of the change in current in the main current loop.

11. The method of claim 10, comprising periodically resetting the capacitor responsive to a reset signal.

12. The method of claim 11, comprising permitting the capacitor to integrate the rectified voltage over a plurality of sampling periods prior to resetting the capacitor.

13. The method of claim 10, comprising:
comparing the voltage across the capacitor to a plurality of thresholds; and
generating the current information signal based on which of the plurality of thresholds the voltage exceeds.

14. A circuit, comprising:
a power circuit having a main current loop; and
a current sensing circuit spaced apart from and electrically decoupled from the power circuit, the current sensing circuit operable to generate a voltage proportional to an electromagnetic field generated responsive to a current change in the main current loop of the power circuit and generate a current information signal based on the voltage, the current information signal describing the current in the main current loop, the current sensing circuit comprising:
a conductive loop spaced apart from the power circuit and disposed over at least a portion of the main current loop, the conductive loop electrically decoupled from the power circuit and operable to generate the voltage proportional to the electromagnetic field;
a rectifier coupled to the conductive loop and operable to rectify the voltage generated by the conductive loop;
a capacitor coupled to the rectifier and operable to accumulate charge responsive to the rectified voltage, wherein a voltage across the capacitor is related to the current in the main current loop; and
a switch device coupled to the capacitor and operable to periodically reset the capacitor responsive to a reset signal and permit the capacitor to integrate the rectified voltage over a plurality of sampling periods prior to resetting the capacitor.

15. A circuit, comprising:
a power circuit having a main current loop; and
a current sensing circuit spaced apart from and electrically decoupled from the power circuit, the current sensing circuit operable to generate a voltage proportional to an electromagnetic field generated responsive to a current change in the main current loop of the power circuit and generate a current information signal based on the voltage, the current information signal describing the current in the main current loop, the current sensing circuit comprising:
a conductive loop spaced apart from the power circuit and disposed over at least a portion of the main current loop, the conductive loop electrically decoupled from the power circuit and operable to generate the voltage proportional to the electromagnetic field;
a rectifier coupled to the conductive loop and operable to rectify the voltage generated by the conductive loop;
a capacitor coupled to the rectifier and operable to accumulate charge responsive to the rectified voltage, wherein a voltage across the capacitor is related to the current in the main current loop; and
an analysis circuit operable to compare the voltage across the capacitor to a plurality of thresholds and generate the current information signal based on which of the plurality of thresholds the voltage exceeds.

16. The circuit of claim 15, wherein the analysis circuit comprises at least one of an analog-to-digital converter, an amplifier and a trigger circuit.

17. The circuit of claim 15, wherein the analysis circuit is operable to analyze the voltage across the capacitor over a plurality of sampling periods and smooth the current information signal over the plurality of sampling periods.

* * * * *